(12) United States Patent
Yang

(10) Patent No.: US 7,502,218 B2
(45) Date of Patent: Mar. 10, 2009

(54) MULTI-TERMINAL CAPACITOR

(75) Inventor: Shun Cheng Yang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 245 days.

(21) Appl. No.: 11/270,226

(22) Filed: Nov. 9, 2005

(65) Prior Publication Data

US 2007/0102788 A1    May 10, 2007

(51) Int. Cl.
*H01G 4/38* (2006.01)

(52) U.S. Cl. .................. 361/328; 361/330; 361/303; 361/305; 361/306.2; 361/306.3

(58) Field of Classification Search .............. 361/321.1, 361/321.2, 311–313, 306.1, 306.3, 302–305, 361/328–330, 306.2, 81, 83
See application file for complete search history.

(56) References Cited

U.S. PATENT DOCUMENTS

| | | | | |
|---|---|---|---|---|
| 5,583,359 A | * | 12/1996 | Ng et al. | 257/306 |
| 5,644,255 A | * | 7/1997 | Taylor | 326/81 |
| 5,672,983 A | * | 9/1997 | Yamamoto et al. | 326/27 |
| 5,939,766 A | * | 8/1999 | Stolmeijer et al. | 257/534 |
| 5,973,909 A | * | 10/1999 | Moncrieff | 361/312 |
| 6,201,412 B1 | * | 3/2001 | Iwata et al. | 326/83 |
| 6,900,976 B2 | * | 5/2005 | Hiraoka et al. | 361/277 |
| 7,095,072 B2 | | 8/2006 | Furumiya et al. | |
| 7,417,275 B2 | | 8/2008 | Liu | |
| 2004/0140487 A1 | | 7/2004 | Furumiya et al. | |

* cited by examiner

*Primary Examiner*—Nguyen T Ha
(74) *Attorney, Agent, or Firm*—K & L Gates LLP

(57) ABSTRACT

A multi-terminal capacitor includes a first capacitor plate, a second capacitor plate in parallel with the first capacitor plate, and a third capacitor plate in parallel with the first and second capacitor plates. The first, second and third capacitor plates are separated from each other by dielectric material, such that the first, second and third capacitor plates function as a first, second and third terminals, respectively, for capacitors formed therebetween.

12 Claims, 18 Drawing Sheets

MULTI-TERMINAL CAPACITOR

BACKGROUND

The present invention relates generally to semiconductor integrated circuit (IC) designs, and more particularly to designs of multi-terminal capacitors.

Active devices, such as bipolar transistors and field effect transistors, and passive devices, such as resistors, capacitors, and inductors, are often utilized in ICs. Circuits that contain multi-phase signals or circuits that need matching networks for differential inputs or outputs require a rather complicated capacitor network to achieve their intended functions. Conventionally, such capacitor network is configured by connecting a number of two-terminal capacitors according to the specification requirements. For example, a number of two-terminal capacitors may be connected in a serial or parallel fashion in order to provide those circuits with a multiple terminal capacitor network with certain electrical characteristics.

Conventionally, a capacitor typically occupies its own space that cannot be used by another capacitor in an IC chip. This results in an inefficient use of space. As the demand for advanced technologies continues to grow, the need to pack more electronic devices into a small area of semiconductor substrate increases. As such, desirable in the art of IC designs are more space-efficient capacitors that can satisfy various design requirements for multiple terminal capacitor networks.

SUMMARY

The present invention discloses a multi-terminal capacitor formed in a semiconductor structure. In one embodiment of the invention, the multi-terminal capacitor includes a first capacitor plate, a second capacitor plate in parallel with the first capacitor plate, and a third capacitor plate in parallel with the first and second capacitor plates. The first, second and third capacitor plates are separated from each other by dielectric material, such that the first, second and third capacitor plates function as a first, second and third terminals, respectively, for capacitors formed therebetween.

The construction and method of operation of the invention, however, together with additional objectives and advantages thereof will be best understood from the following description of specific embodiments when read in connection with the accompanying drawings.

DESCRIPTION

Figure 1A:
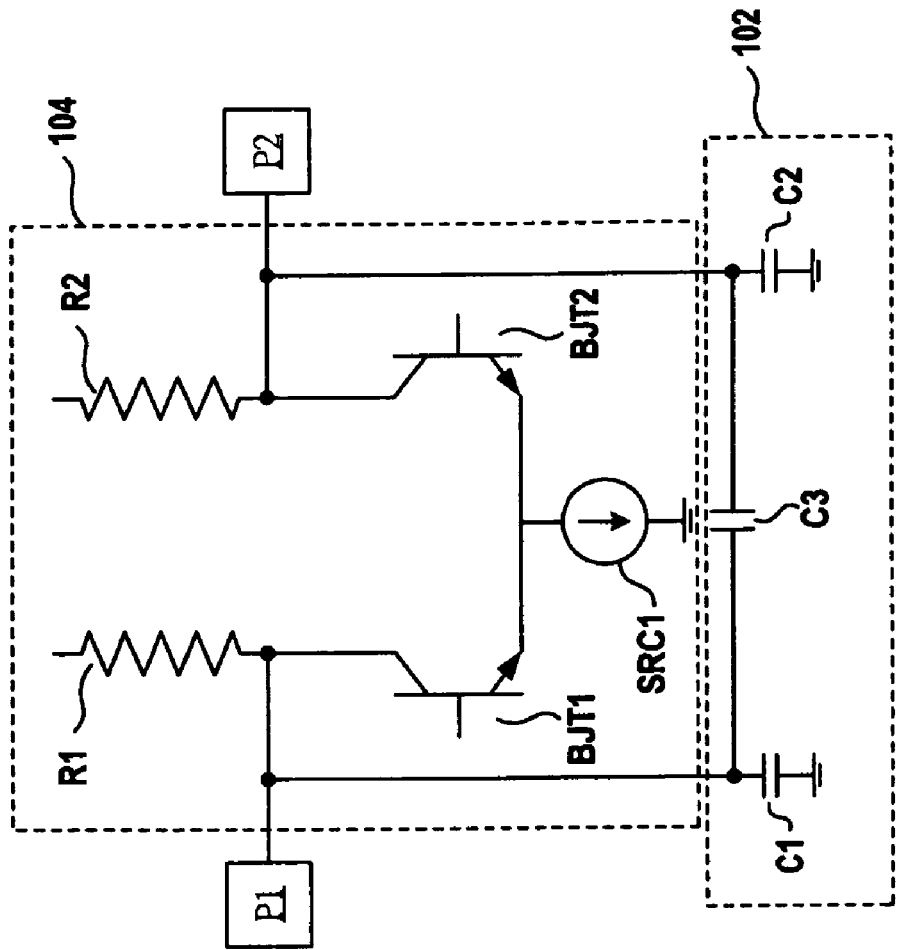
FIG. 1A schematically illustrates a conventional circuit with differential outputs.

FIG. 1A schematically illustrates a circuit 100 with differential outputs. A capacitor matching network 102, having capacitors C1, C2, and C3, is connected to a circuit module 104 with differential outputs P1 and P2, which are further connected to a power supply (not shown in the figure) through resistors R1 and R2, respectively. The differential outputs P1 and P2 are also connected to a current source SRC1 through transistors BJT1 and BJT2, respectively. Conventionally, each of the capacitors C1, C2 and C3 occupies its own space that cannot be used by the other two capacitors in an IC chip. Thus, the construction of the capacitor network 102 requires a significant area of semiconductor substrate.

Figure 1B:
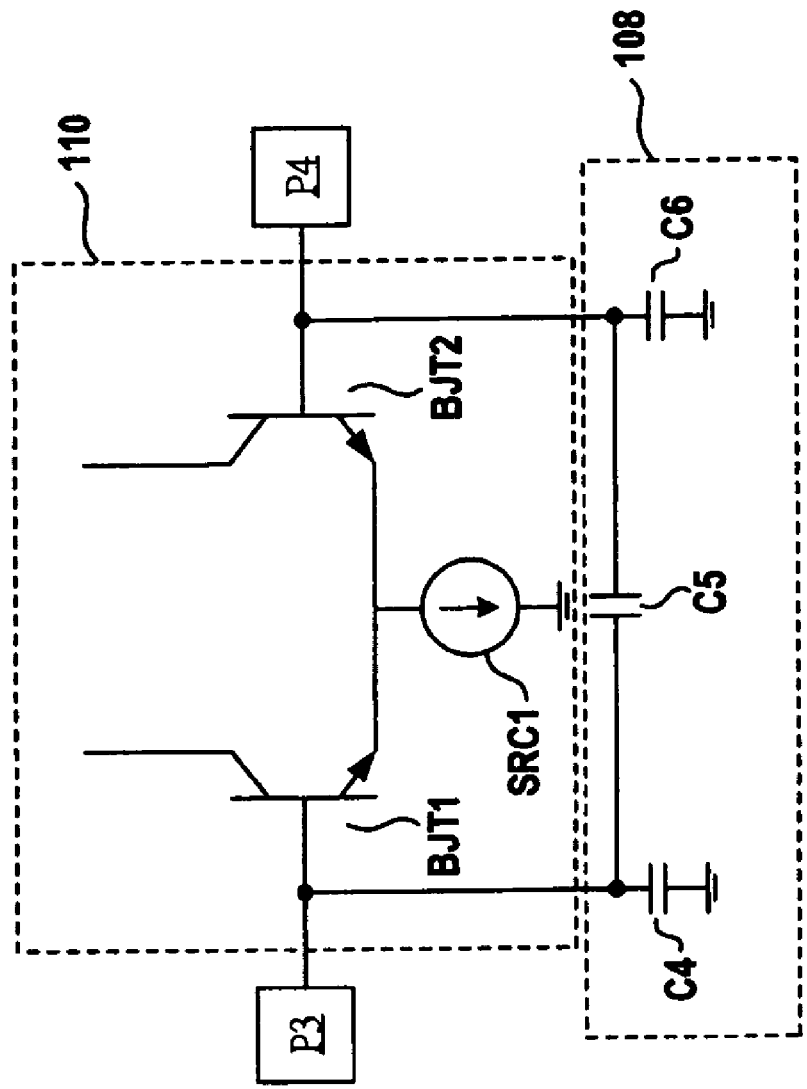
FIG. 1B schematically illustrates another conventional circuit with differential inputs.

FIG. 1B schematically illustrates a circuit 106 with differential inputs. A capacitor matching network 108, having capacitors C4, C5, and C6, is connected to a circuit module 110 with differential inputs P3 and P4, which are further connected to a current source SRC1 through transistors BJT1 and BJT2, respectively. Again, conventionally, each of the capacitors C4, C5 and C6 occupies its own space that cannot be used by the other two capacitors in an IC chip. Thus, the construction of the capacitor network 108 requires a significant area of semiconductor substrate.

Figure 2:
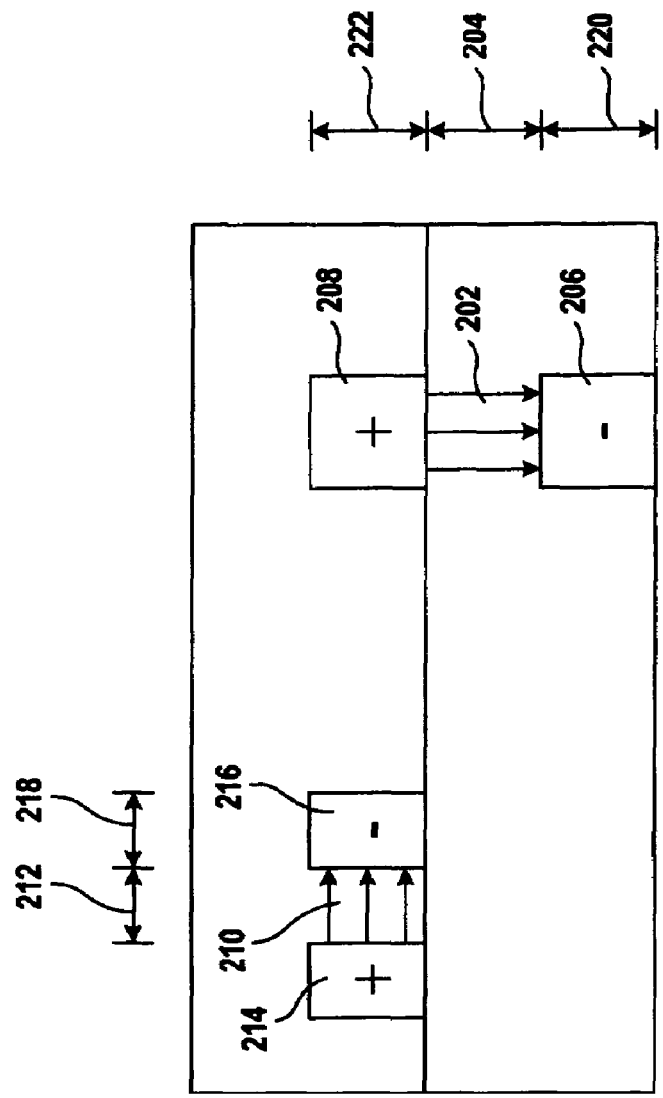
FIG. 2 illustrates a cross-sectional view of a semiconductor structure in which a horizontal capacitor and a vertical capacitor are disposed.

FIG. 2 illustrates a cross-sectional view 200 of a semiconductor structure, in which a conductive pattern 206 is formed in a first level dielectric, and conductive patterns 208, 214 and 216 are formed in a second level dielectric. The conductive pattern 216 has a width indicated by a numeral 218. The conductive patterns 206 and 208 have depths indicated by numerals 220 and 222, respectively. Vertical electric field lines 202 are drawn extending across a dielectric thickness 204 between the conductive patterns 206 and 208 for showing the electrical field therebetween. Also, horizontal electric field lines 210 are drawn extending across a dielectric thickness 212 between the conductive patterns 214 and 216 for showing the electrical filed therebetween. The horizontal spacing of the dielectric thickness 212 between the conductive patterns 214 and 216 on the same level is typically smaller than the vertical dielectric thickness 204 between the conductive patterns 206 and 208 on successive levels. This means that the electric field density, and therefore, the capacitance between conductive patterns on the same level can be significantly greater than the electric field density and the capacitance between patterns on successive levels. Thus, it is desirable to deign capacitors by using adjacent conductive patterns on the same level, instead on successive levels.

Figure 3:
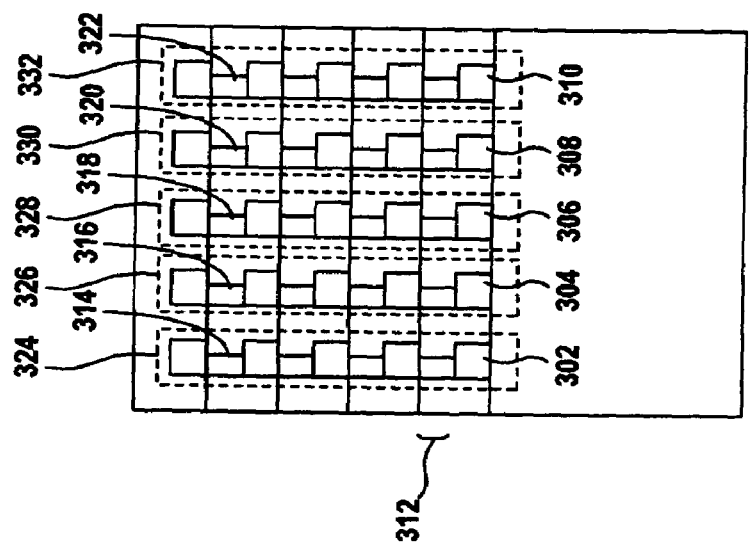
FIG. 3 illustrates a cross-sectional view of a multi-terminal capacitor in accordance with one embodiment of the present invention.

FIG. 3 illustrates a cross-sectional view 300 of a semiconductor structure is illustrated in accordance with one embodiment of the present invention. Five exemplary conductive patterns 302, 304, 306, 308, and 310 are horizontally disposed on a bottom level of the semiconductor structure. The second level from bottom includes conductive patterns that are identical to those on the bottom level and lying directly above them. Dielectric material 312 separating the conductive patterns is disposed on each level. A number of via contacts 314, 316, 318, 320, and 322 connect each one of the conductive patterns 302, 304, 306, 308, and 310 with its corresponding conductive pattern thereabove. This configuration is repeated upward through the five exemplary levels that are shown in this figure, thereby providing five adjacent capacitor plates 324, 326, 328, 330, and 332. A capacitor is formed between two adjacent capacitor plates. For example, a capacitor is formed between the plates 324 and 326, or between the plates of 330 and 332.

Figure 4:
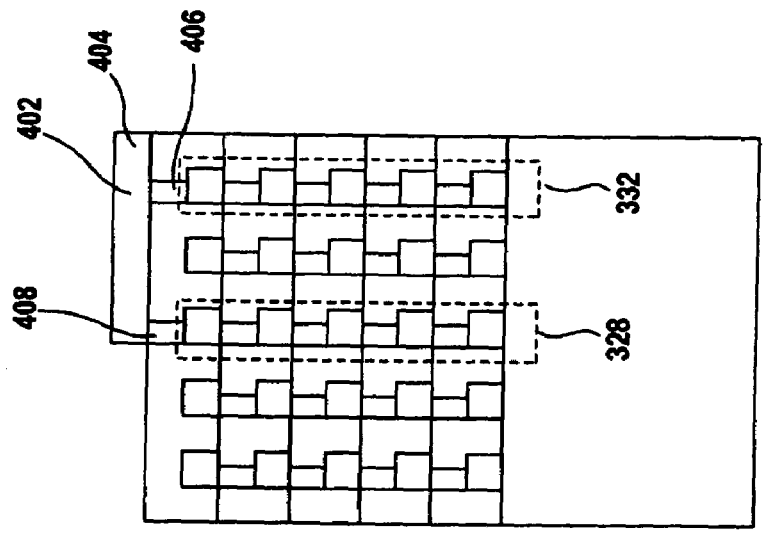
FIG. 4 illustrates a cross-sectional view of a multi-terminal capacitor in accordance with one embodiment of the present invention.

FIG. 4 illustrates a cross-sectional view 400 of a semiconductor structure 400, in which a conductive pattern 402 is provided on yet another level 404, in accordance with one embodiment of the present invention. The conductive pattern 402 essentially serves as an electrical bridge between the two via contacts 406 and 408, which are connected to the capacitor plates 332 and 328, respectively. Such a short connection between the capacitor plates can reduce the number of capacitor terminals as it will be explained in further detail below.

Figure 5:
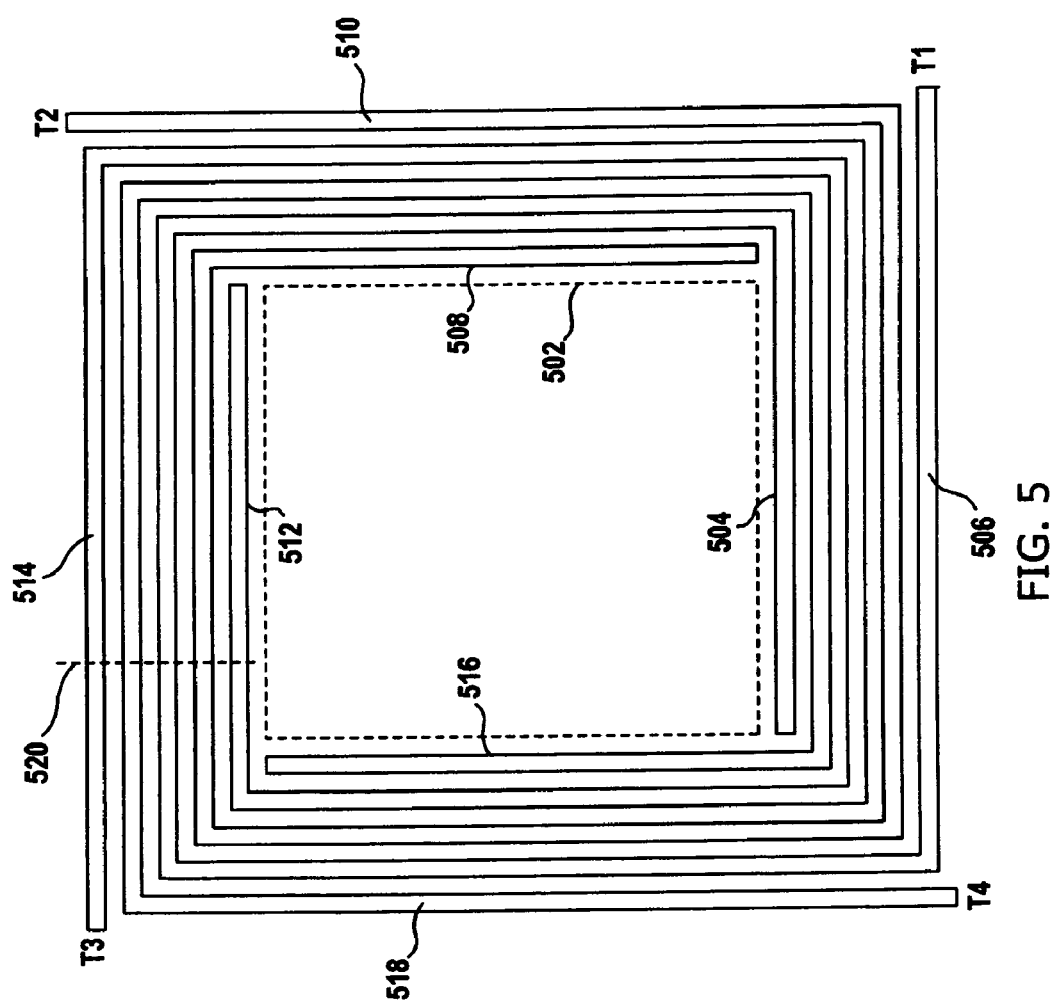
FIG. 5 illustrates a top view of a four-terminal capacitor in accordance with one embodiment of the present invention.

FIG. 5 illustrates a top view 500 of a four-terminal capacitor in accordance with one embodiment of the present invention. The four terminals T1, T2, T3, and T4 are connected to the outer ends of the four capacitor plates 506, 510, 514 and 518 at the outer corners of the square-shaped capacitor 500. Along the boundary of a square open inner space 502, lies a straight section 504 of the capacitor plate 506. The square open inner space 502 can be used for placement of various integrated circuit components, and the capacitor plates surrounding them can protect the same from outside noise or interference.

The capacitor plate 506, spirally winding outward in a counterclockwise direction, turns a right angle outside an adjacent straight section 508 of the capacitor plate 510. Similarly, the capacitor plate 510, spirally winding outward in a counterclockwise direction, turns a right angle outside an adjacent straight section 512 of the capacitor plate 514. Similarly, the capacitor plate 514, spirally winding outward in a counterclockwise direction, turns a right angle outside an adjacent straight section 516 of the capacitor plate 518. Similarly, the capacitor plate 518, spirally winding outward in a counterclockwise direction, turns a right angle outside the adjacent straight section 504 of the capacitor plate 506. This outward counterclockwise square spiral winding of adjacent capacitor plates continues until each vertical capacitor plate has at least five straight sections. A detailed cross-sectional view of the four-terminal capacitor along the line 520 is depicted in FIG. 3.

Figure 6:
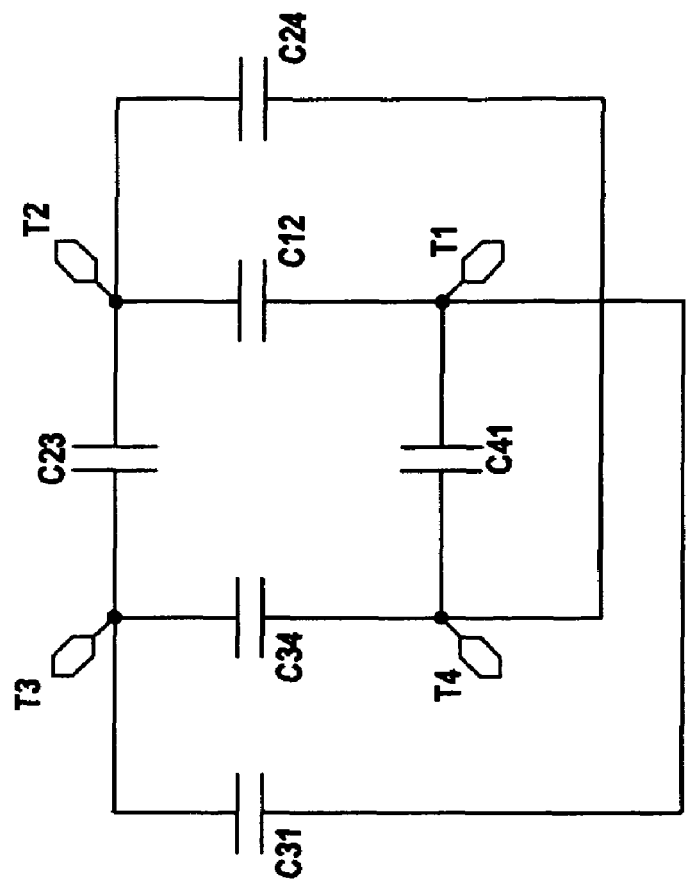
FIG. 6 schematically illustrates an equivalent electrical circuit of the four-terminal capacitor in accordance with one embodiment of the present invention.

FIG. 6 schematically illustrates an equivalent circuit 600 of the four-terminal capacitor shown in FIG. 5. C12, for example, denotes the capacitance between the capacitor plates connected to the terminals T1 and T2. Similar relationships hold between C23 and the terminals T2 and T3, C34 and the terminals T3 and T4, and C41 and the terminals T4 and T1. Similar relationships also hold between C24 and the terminals T2 and T4, and C31 and the terminals T3 and T1. It is understood by those skill in the art that the capacitance values of C12, C23, C34, and C41 are related to physical dimensions of capacitor plates and the dielectric material disposed therebetween. It is noted that this naming convention will be continued for various embodiments below.

Figure 7:
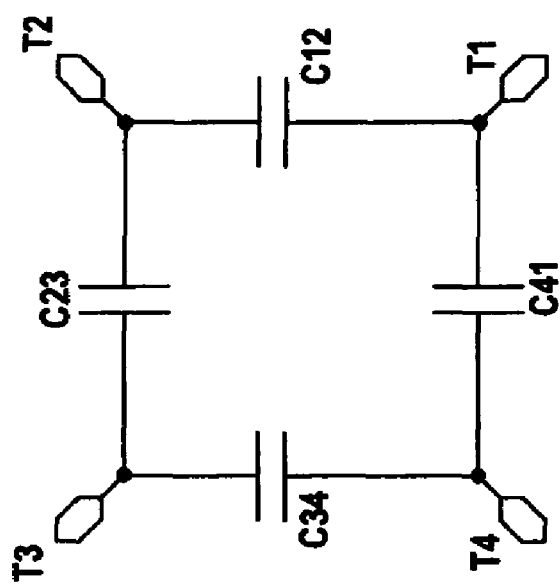
FIG. 7 schematically illustrates a simplified equivalent circuit of the four-terminal capacitor in accordance with one embodiment of the present invention.

In most cases, the capacitances of C31 and C24 are negligible compared to those of C12, C23, C34 and C41. Thus, the circuit 600 can be simplified as the circuit 700 shown in FIG. 7.

Figure 8B:
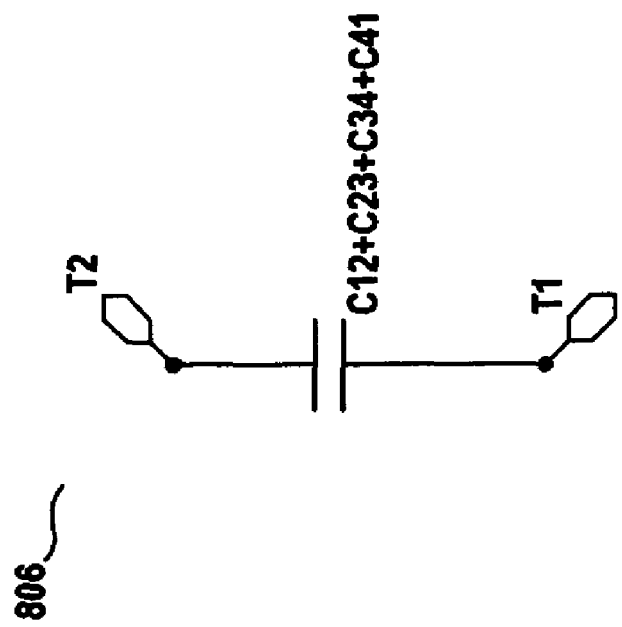
FIGS. 8A and 8B schematically illustrate equivalent circuits of the capacitor with its terminal number reduced in accordance with one embodiment of the present invention.
Figure 8A:
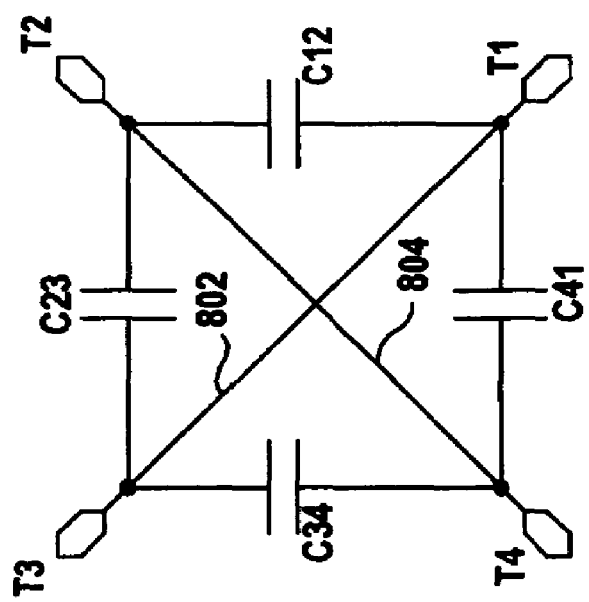

In FIG. 8A, an equivalent circuit 800 shows that the terminals T1 and T3 are connected by an electrical short 802 and the terminals T2 and T4 are connected by an electrical short 804. FIG. 8B illustrates a simplified equivalent circuit 806 of a two-terminal capacitor with the capacitance between the terminals T1 and T2 as the sum of C12, C23, C34, and C41.

Figure 9:
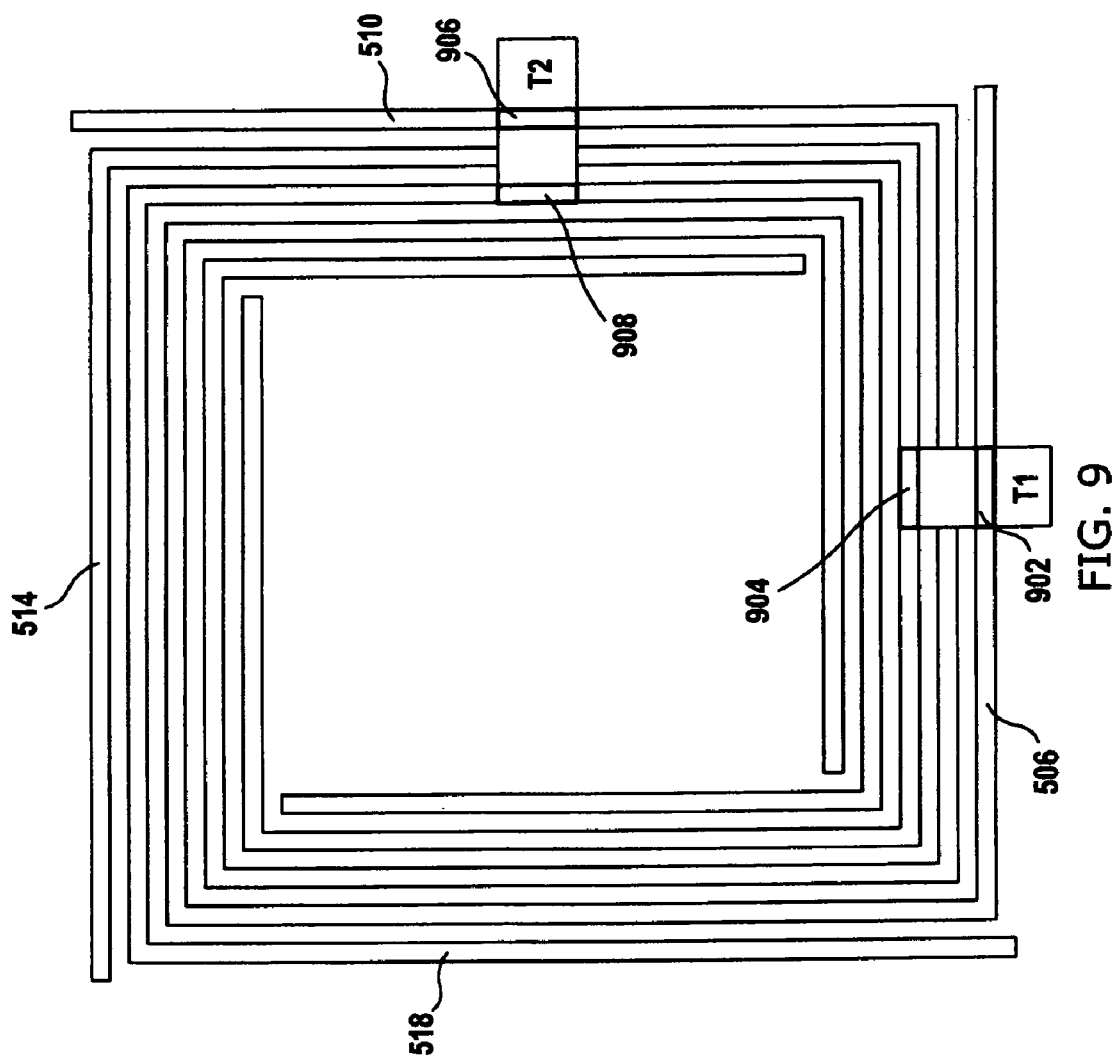
FIG. 9 illustrates a top view of a reduced two-terminal capacitor in accordance with one embodiment of the present invention.

FIG. 9 illustrates a top view 900 of a two-terminal capacitor that is constructed by selectively connecting the terminals of the four-terminal capacitor shown in FIG. 5 in accordance with one embodiment of the present invention. Here, the terminals T1 and T2 are disposed, for example, at the center of the outer straight sections of the capacitor plates 506 and 510. Via contacts 902 and 904 electrically bridge the terminal T1 from the capacitor plate 506 to the capacitor plate 514, which was previously connected to the terminal T3. Via contacts 906 and 908 electrically bridge the terminal T2 from the capacitor plate 510 to the capacitor plate 518, which was previously connected to the terminal T4. Essentially, by interleaving a first compound capacitor plate (the capacitor plates 506 and 514) and a second compound capacitor plate (the capacitor plates 510 and 518), the terminal numbers can be reduced by two.

Figure 10:
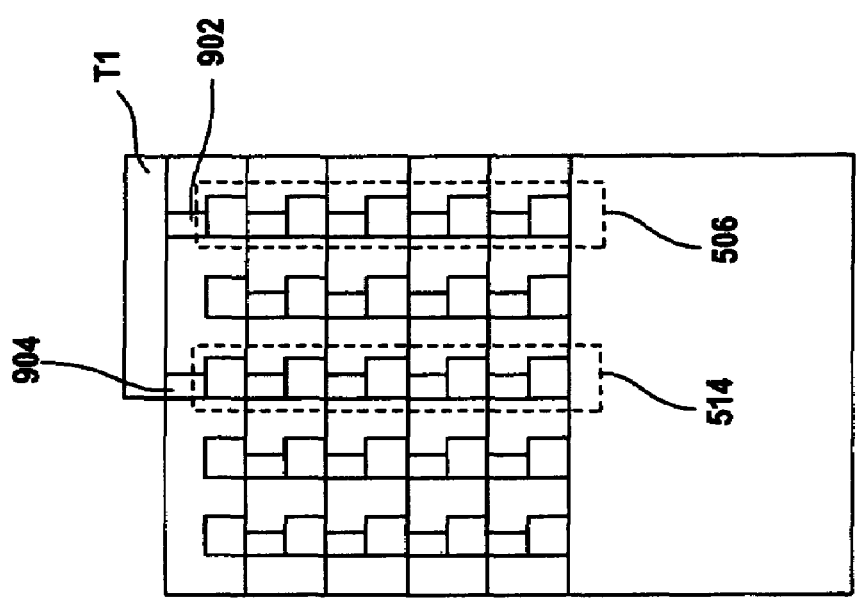
FIG. 10 illustrates a cross-sectional view of the reduced two-terminal capacitor in accordance with one embodiment of the present invention.

FIG. 10 illustrates a cross-sectional view 1000 of the reduced two-terminal capacitor shown in FIG. 9 in accordance with one embodiment of the present invention. The terminal T1 connects the capacitor plates 506 and 514 together through via contacts 902 and 904, respectively.

Figure 11:
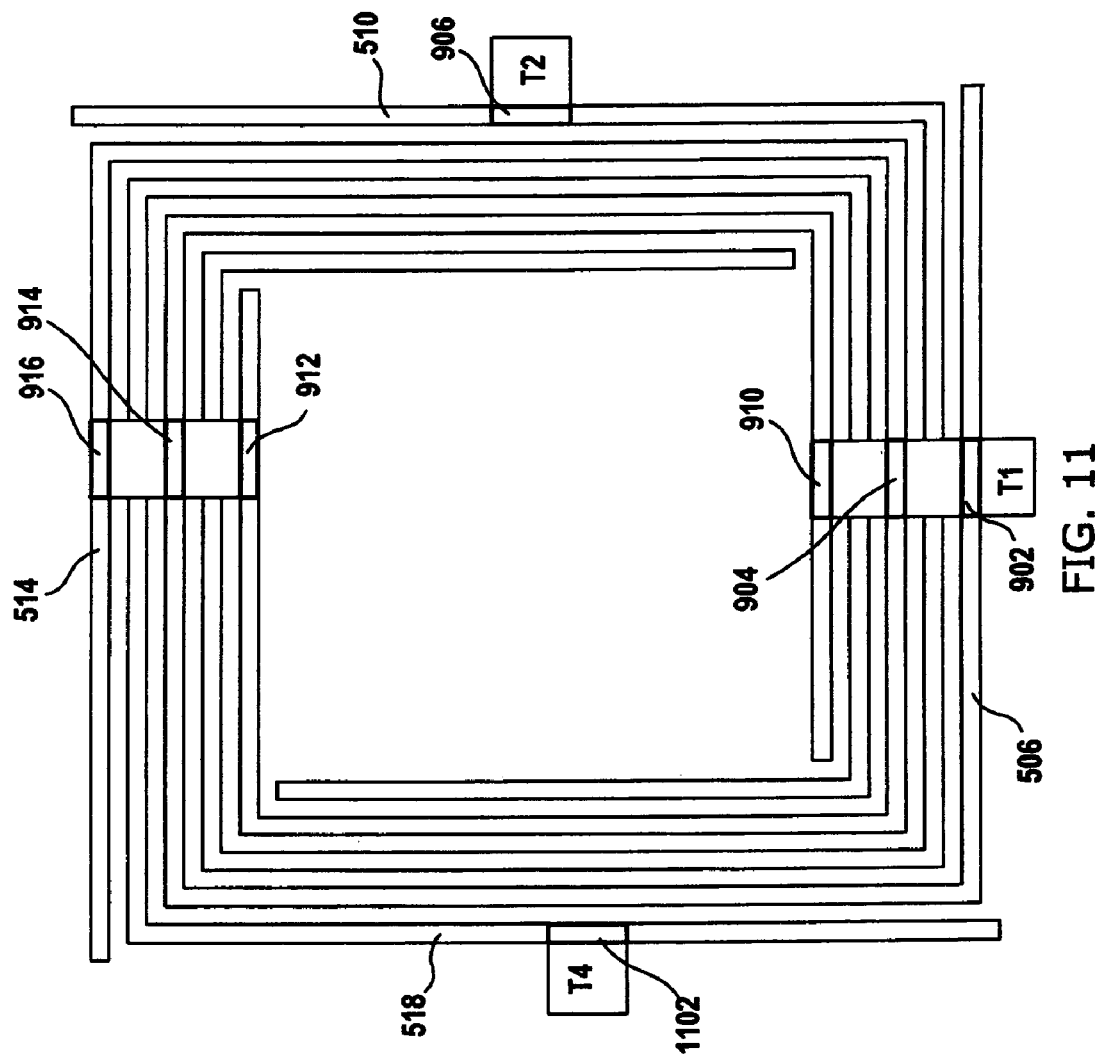
FIG. 11 illustrates a top view of a reduced tree-terminal capacitor in accordance with one embodiment of the present invention.

FIG. 11 illustrates a top view 1100 of a reduced three-terminal capacitor in accordance with one embodiment of the present invention. The terminals T1, T2, and T4 are disposed at the center of the outer straight sections of the capacitor plates 506, 510, and 518. The via contacts 902, 904, 910, 912, 914 and 916 electrically connect the terminal T1 from the capacitor plate 506 to the capacitor plate 514, which was previously connected to the terminal T3. A via contact 906 electrically connects the terminal T2 to the vertical capacitor plate 510. A via contact 1102 electrically connects the terminal T4 to the vertical capacitor plate 518. The set of via contacts 902, 904 and 910 and the set of via contacts 916, 914 and 912 are arranged in a mirror image, such that the parasitic capacitance and inductance between the capacitor plates 5061 and 514 can be reduced.

Figure 12B:
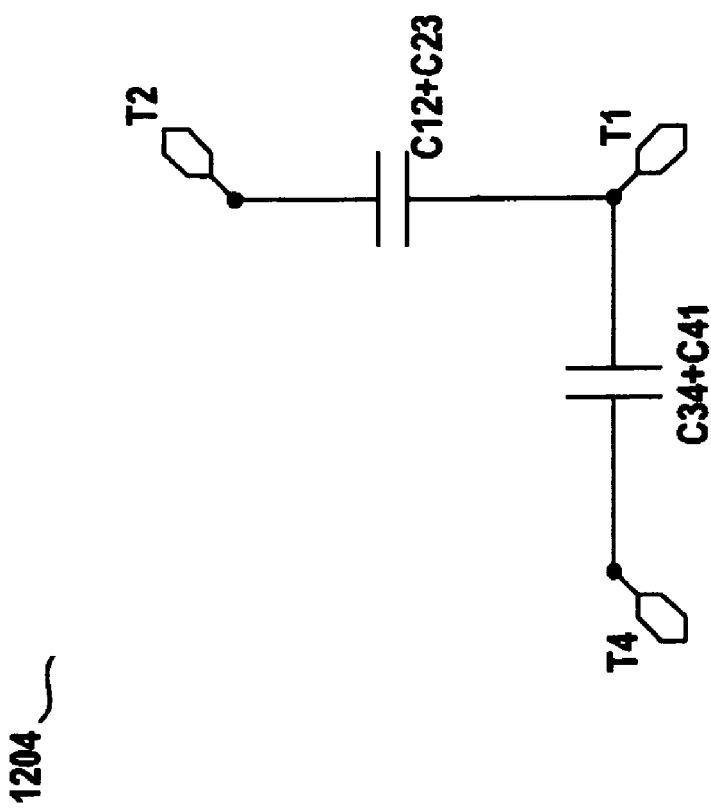
FIGS. 12A and 12B schematically illustrate equivalent circuits of the reduced three-terminal capacitor in accordance with one embodiment of the present invention.
Figure 12A:
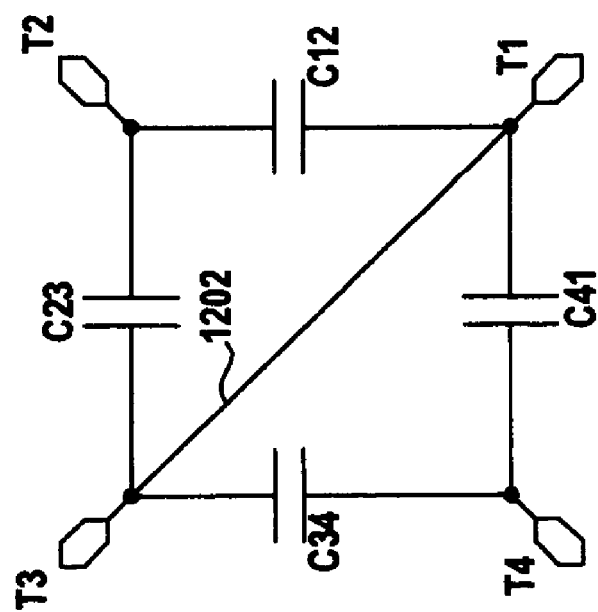

In FIG. 12A, an equivalent circuit 1200 of the reduced three-terminal capacitor shown in FIG. 11 illustrates how the terminals T1 and T3 are connected by an electrical short 1202. In FIG. 12B, a reduced equivalent circuit 1204 illustrates a simplified three-terminal capacitor with the capacitance between terminals T1 and T2 as the sum of C12 and C23 and the capacitance between terminals T1 and T4 as the sum of C34, and C41.

The above-mentioned embodiments and their variations show that a number of capacitors can be constructed in a very compact manner, thereby improving the space-efficiency. It is noted that the spiral capacitor layout is not limited to a square shape. As it will be described in further, other polygonal shapes can also be used for the capacitor layout. Other circular or irregular layouts can also be used as long as the various capacitor plates remain in substantially parallel with each other. Moreover, by selectively connecting the terminals of the capacitor, its number of terminals can be reduced, thereby providing a variety of equivalent capacitor networks.

Figure 13:
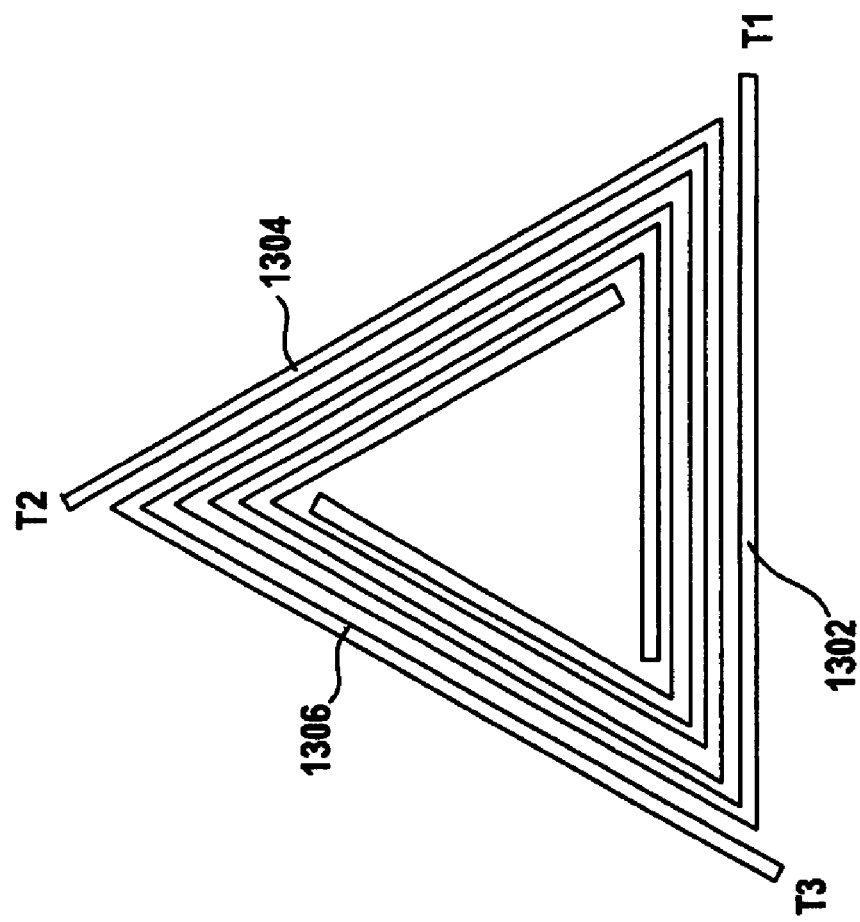
FIG. 13 illustrates a top view of a three-terminal capacitor in accordance with one embodiment of the present invention.

In FIG. 13, a top view 1300 illustrates a three terminal capacitor in accordance with one embodiment of the present invention. Terminals T1, T2, and T3 are connected to the three capacitor plates 1302, 1304, and 1306.

Figure 14:
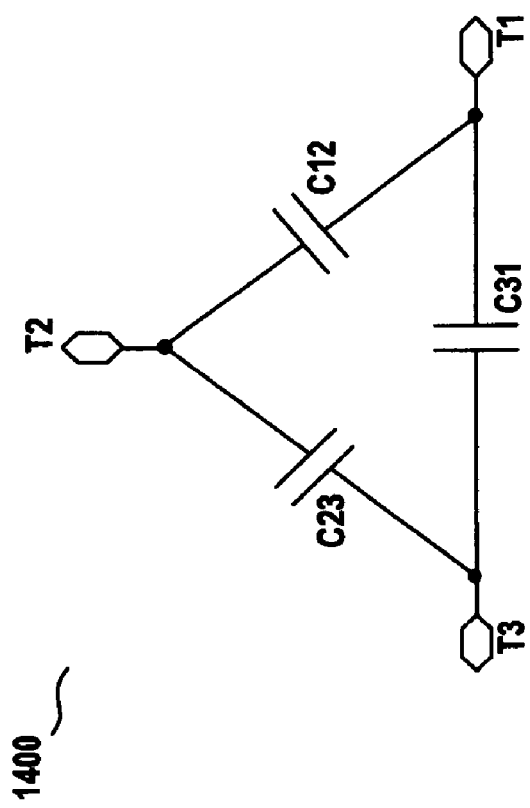
FIG. 14 schematically illustrates an equivalent circuit of the three-terminal capacitor in accordance with one embodiment of the present invention.

In FIG. 14, an equivalent circuit 1400 illustrates the capacitances available in FIG. 13 between any two terminals. C12, for example, denotes the capacitance between the capacitor plates connected to the terminals T1 and T2. Similar relationships hold between C23 and the terminals T2 and T3, as well as between C31 and the terminals T3 and T1.

Figure 15:
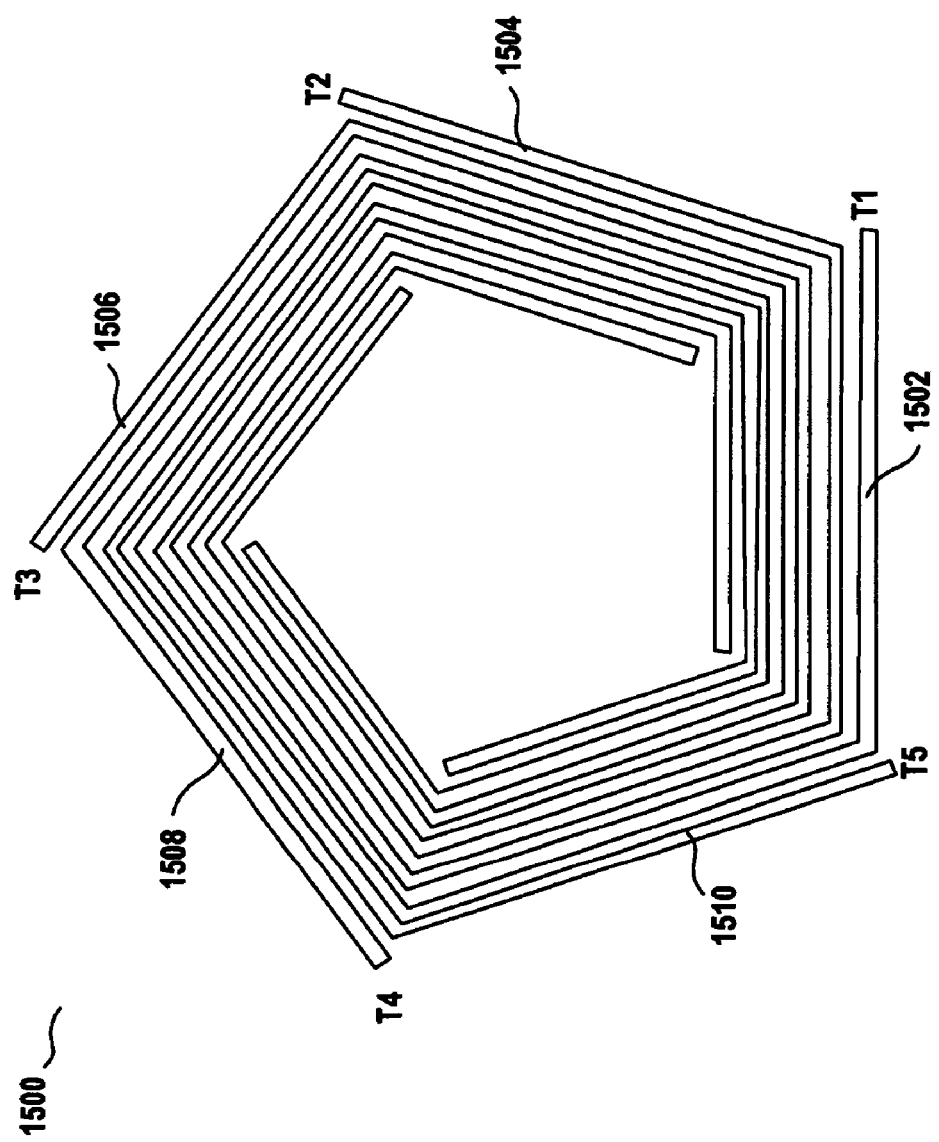
FIG. 15 illustrates a top view of a five-terminal capacitor in accordance with one embodiment of the present invention.

In FIG. 15, a top view 1500 illustrates a five terminal capacitor in accordance with one embodiment of the present invention. Terminals T1, T2, T3, T4, and T5 are connected to the five capacitor plates 1502, 1504, 1506, 1508, and 1510.

Figure 16:
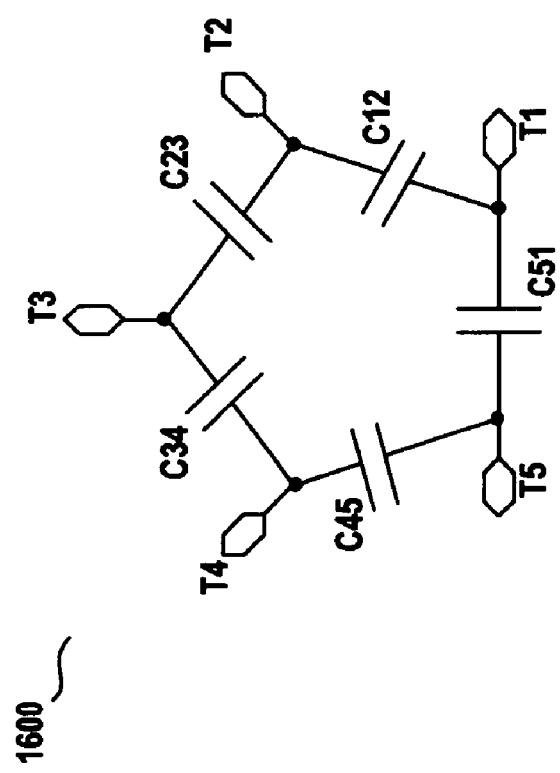
FIG. 16 schematically illustrates an equivalent circuit of the five-terminal capacitor in accordance with one embodiment of the present invention.

In FIG. 16, an equivalent circuit 1600 illustrates the capacitances available in FIG. 15 between any two terminals. C12, for example, denotes the capacitance between the vertical capacitor plates connected to the terminals T1 and T2. Similar relationships hold between C23 and the terminals T2 and T3, between C34 and the terminals T3 and T4, between C45 and the terminals T4 and T5, as well as between C51 and the terminals T5 and T1.

Figure 17A:
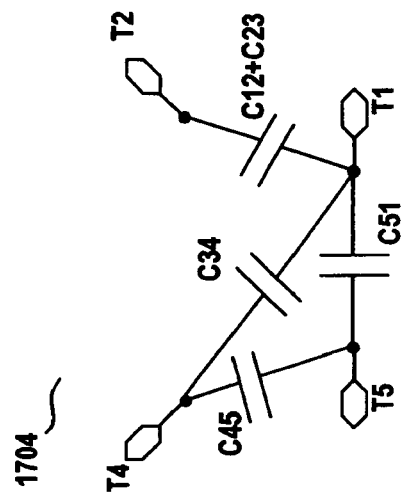
FIGS. 17A and 17B schematically illustrate the equivalent circuits of the five-terminal capacitor whose terminal number is reduced by one in accordance with one embodiment of the present invention.
Figure 17B:
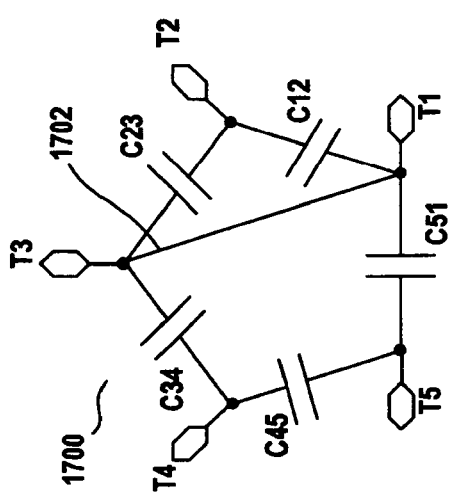

Now, various simplifying reductions from a five terminal capacitor will be considered in accordance with another embodiment of the present invention. In FIG. 17A, an equivalent circuit 1700 is a modification of the equivalent circuit 1600 in FIG. 16. Here, the terminals T1 and T3 are connected by an electrical short 1702. In FIG. 17B, an equivalent circuit 1704 illustrates the resulting reduction to a four-terminal capacitor with the following capacitance values: C12+C23 from the terminal T1 to the terminal T2, C34 from the terminal T1 to the terminal T4, C51 from the terminal T1 to the terminal T5, and C45 from the terminal T4 to the terminal T5.

Figure 18A:
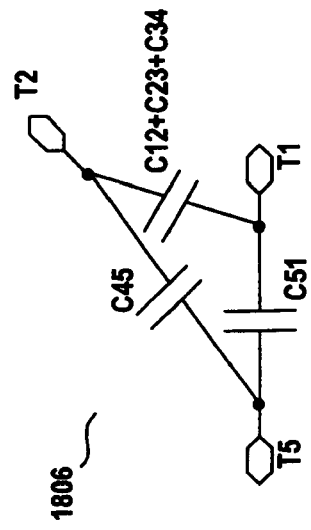
FIGS. 18A and 18B schematically illustrate the equivalent circuits of the five-terminal capacitor whose terminal number is reduced by two in accordance with one embodiment of the present invention.
Figure 18B:
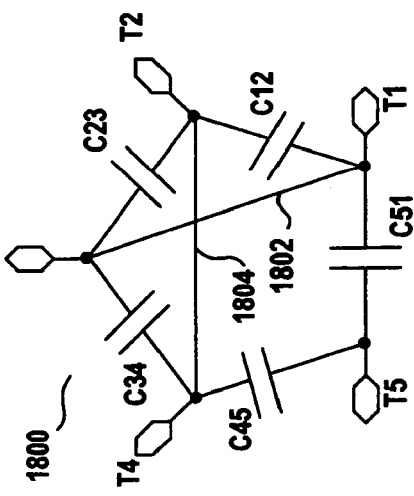

In FIG. 18A, an equivalent circuit 1800 is another modification. Here, the terminals T1 and T3 are connected by an electrical short 1802, while the terminals T2 and T4 are connected by an electrical short 1804. In FIG. 18B, an equivalent circuit 1806 illustrates the resulting reduction to a three-terminal capacitor with the following capacitance values: C12+C23+C34 from the terminal T1 to the terminal T2, and C51 from the terminal T1 to the terminal T5, and C45 from the terminal T2 to the terminal T5.

Figure 19B:
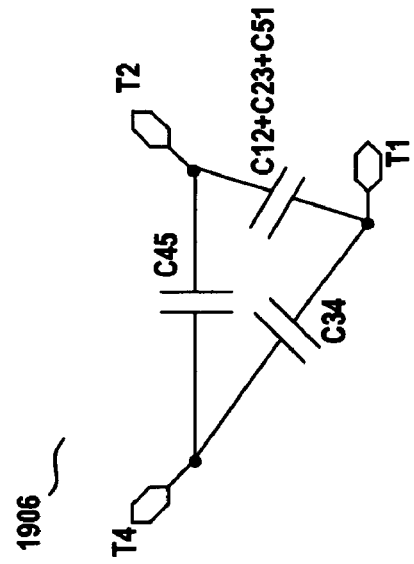
FIGS. 19A and 19B schematically illustrate the equivalent circuits of the five-terminal capacitor whose terminal number is also reduced by two in accordance with one embodiment of the present invention.
Figure 19A:
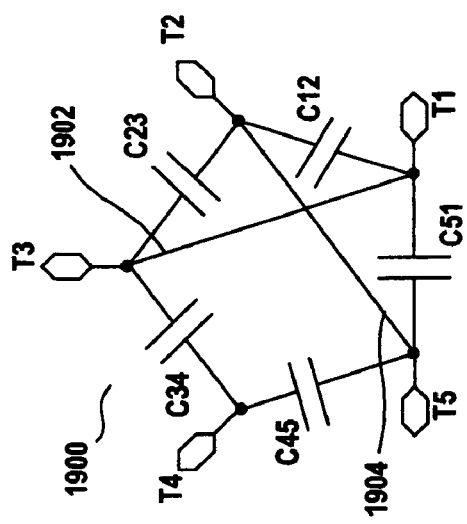

In FIG. 19A, an equivalent circuit 1900 is another modification. Here, the terminals T1 and T3 are connected by an electrical short 1902, and the terminals T2 and T5 are connected by an electrical short 1904. In FIG. 19B, an equivalent circuit 1906 illustrates the resulting reduction to another three-terminal capacitor with the following capacitance values: from C12+C2+C51 from the terminal T1 to the terminal T2, C34 from the terminal T1 to the terminal T4, as well as C45 from the terminal T2 to the terminal T4.

Figure 20B:
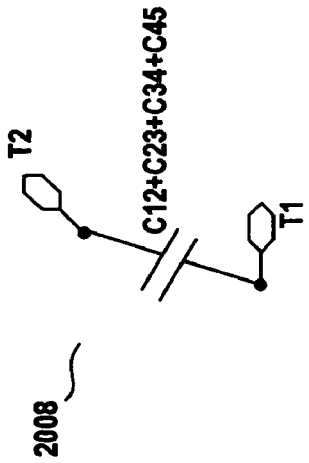
FIGS. 20A and 20B schematically illustrate the equivalent circuits of the five-terminal capacitor whose terminal number is reduced by three in accordance with one embodiment of the present invention.
Figure 20A:
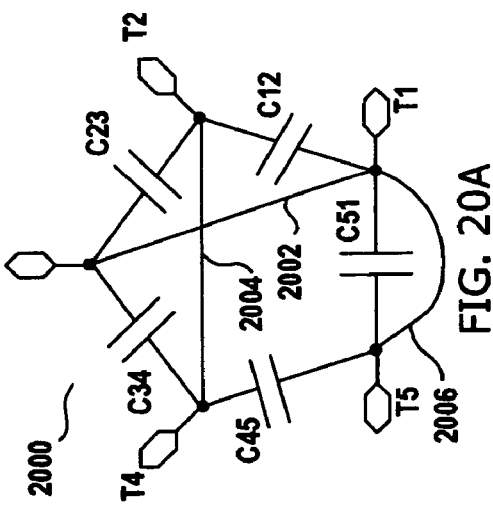

In FIG. 20A, an equivalent circuit 2000 is another modification. Here, the terminals T1 and T3 are connected by an electrical short 2002, the terminals T2 and T4 are connected by an electrical short 2004, and the terminals T1 and T5 are connected by an electrical short 2006. In FIG. 20B, an equivalent circuit 2008 illustrates the resulting reduction to a two-terminal capacitor with a capacitance value of C1+C23+C34+C45.

The present invention allows semiconductor chip layout to be more space efficient by interleaving the plates of more than one capacitor. Individual capacitors no longer require individual border areas, thereby saving a significant amount of space. Also, multiple terminals can be placed more closely together in combined capacitors. Selected electrical shorts can combine selected vertical capacitor plates, thereby increasing some capacitance values and decreasing the count of terminals.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An integrated circuit having at least one multi-terminal capacitor formed in a semiconductor structure, which comprises:
    a first capacitor plate spirally surrounding a central area;
    a second capacitor plate spirally surrounding the central area in parallel with the first capacitor plate; and
    a third capacitor plate spirally surrounding the central area in parallel with the first and second capacitor plates,
    wherein the first, second and third capacitor plates are separated from each other by dielectric material, and outer ends of the first, second and third capacitor plates are toward different directions, such that the first, second and third capacitor plates function as a first, second and third terminals, respectively, for capacitors formed therebetween.

2. The integrated circuit of claim 1 wherein the first, second and third capacitor plates are arranged in a polygonal shape.

3. The integrated circuit of claim 1 wherein the first, second and third capacitor plates are arranged in a circular shape.

4. The integrated circuit of claim 1 wherein each of the first, second and third capacitor plates comprises a first conductive line disposed on a first layer of the semiconductor structure, and a second conductive line disposed on a second layer of the semiconductor structure, the first conductive line being connected to the second conductive line by one or more via contacts.

5. The integrated circuit of claim 1 wherein the multi-terminal capacitor further comprises a conductive pattern for connecting the first capacitor plate to the second capacitor plate, such that the first and second capacitor plates function as a single terminal.

6. The integrated circuit of claim 1 further comprising one or more devices disposed in the central area surrounded by the first, second and third capacitor plates.

7. The integrated of claim 1 operates with multi-phase signals or differential input/output signals.

8. An integrated circuit having at least one multi-terminal capacitor formed in a semiconductor structure, which comprises:
    a first capacitor plate spirally surrounding a central area;
    a second capacitor plate spirally surrounding the central area in parallel with the first capacitor plate; and
    a third capacitor plate spirally surrounding the central area in parallel with the first and second capacitor plates,
    wherein the first, second and third capacitor plates are separated from each other by dielectric material, such that the first, second and third capacitor plates function as a first, second and third terminals, respectively, for capacitors formed therebetween, p1 wherein each of the first, second and third capacitor plates comprises a first conductive line disposed on a first layer of the semiconductor structure, and a second conductive line disposed on a second layer of the semiconductor structure, the first conductive line being connected to the second conductive line by one or more via contacts.

9. The integrated circuit of claim 8 wherein the first, second and third capacitor plates are arranged in a polygonal or circular shape.

10. The integrated circuit of claim 8 wherein the multi-terminal capacitor further comprises a conductive pattern for connecting the first capacitor plate to the second capacitor plate, such that the first and second capacitor plates function as a single terminal.

11. The integrated circuit of claim 8 further comprising one or more devices disposed in the central area surrounded by the first, second and third capacitor plates.

12. The integrated of claim 8 operates with multi-phase signals or differential input/output signals.

* * * * *

UNITED STATES PATENT AND TRADEMARK OFFICE
CERTIFICATE OF CORRECTION

PATENT NO. : 7,502,218 B2  
APPLICATION NO. : 11/270226  
DATED : March 10, 2009  
INVENTOR(S) : Shun Cheng Yang Page 1 of 1

It is certified that error appears in the above-identified patent and that said Letters Patent is hereby corrected as shown below:

Title Page item (73) Assignee: Taiwan Semiconductor Manufacturing Co., Ltd., Hsin-Chu (TW) should read: --VIA Technologies, Inc. of R.O.C., Taipai, Taiwan--.

Signed and Sealed this

Twenty-second Day of December, 2009

David J. Kappos  
*Director of the United States Patent and Trademark Office*